(12) United States Patent
Koyanagi et al.

(10) Patent No.: US 7,420,117 B2
(45) Date of Patent: Sep. 2, 2008

(54) PHOTOVOLTAIC CELL

(75) Inventors: Tsuguo Koyanagi, Kitakyushu (JP); Michael Graetzel, Suisse (DE)

(73) Assignee: Catalysts & Chemicals Industries Co., Ltd. (JP)

( * ) Notice: Subject to any disclaimer, the term of this patent is extended or adjusted under 35 U.S.C. 154(b) by 487 days.

(21) Appl. No.: 10/417,659

(22) Filed: Apr. 17, 2003

(65) Prior Publication Data
US 2003/0196692 A1  Oct. 23, 2003

(30) Foreign Application Priority Data
Apr. 17, 2002 (JP) .............................. 2002-115387

(51) Int. Cl.
*H01L 31/00* (2006.01)
(52) U.S. Cl. ...................... 136/263; 136/256
(58) Field of Classification Search .................. 136/263
See application file for complete search history.

(56) References Cited

U.S. PATENT DOCUMENTS

| | | | | |
|---|---|---|---|---|
| 5,350,644 | A | * 9/1994 | Graetzel et al. | ............. 429/111 |
| 5,482,570 | A | 1/1996 | Saurer et al. | |
| 6,069,313 | A | * 5/2000 | Kay | ............................ 136/249 |
| 6,291,763 | B1 | * 9/2001 | Nakamura | .................... 136/256 |
| 6,538,194 | B1 | * 3/2003 | Koyanagi et al. | ............ 136/256 |
| 6,580,026 | B1 | 6/2003 | Koyanagi et al. | |

FOREIGN PATENT DOCUMENTS

| | | |
|---|---|---|
| EP | 1 119 068 A1 | 7/2001 |
| EP | 1 174 891 A2 | 1/2002 |
| FR | 2 694 451 A1 | 2/1994 |
| JP | 01-220380 A | 9/1989 |
| JP | 5-504023 A | 6/1993 |

(Continued)

OTHER PUBLICATIONS

Chen, S.G. et al., "Preparation of $Nb_2O_5$ Coated $TiO_2$ Nanoporous Electrodes and Their Application in Dye-Sensitized Solar Cells", *American Chemical Society*, Dec. 2001, vol. 13, No. 12, pp. 4629-4634, Chemistry of Materials American Chemical Society, USA.

(Continued)

*Primary Examiner*—Alex Noguerola
*Assistant Examiner*—Jeffrey T. Barton
(74) *Attorney, Agent, or Firm*—The Webb Law Firm, P.C.

(57) ABSTRACT

A photovoltaic cell includes a substrate having an electrode layer on the surface and having a porous metal oxide semiconductor film which is formed on the electrode layer and on which a photosensitizer is adsorbed, a substrate having an electrode layer on the surface, both of said substrates being arranged in such a manner that the electrode layer and the electrode layer face each other, and an electrolyte layer provided between the semiconductor film and the electrode layer, wherein the semiconductor film contains an inhibitor of back current, and at least one pair of substrate and electrode layer thereon have transparency. The photovoltaic cell is capable of inhibiting back current and decomposition of a spectrosensitizing dye caused by the ultraviolet rays, has high photoelectric conversion efficiency and is capable of generating high electromotive force.

12 Claims, 1 Drawing Sheet

FOREIGN PATENT DOCUMENTS

| | | |
|---|---|---|
| JP | 6-511113 A | 12/1994 |
| JP | 07-140472 A | 6/1995 |
| JP | 07-095165 B2 | 10/1995 |
| JP | 11-339867 A | 12/1999 |
| JP | 2001-015182 A | 1/2001 |
| JP | 2001-155791 A | 6/2001 |
| WO | WO 91/16719 A2 | 10/1991 |
| WO | WO 92/06402 A1 | 4/1992 |
| WO | WO 93/18532 A1 | 9/1993 |
| WO | WO 99/63614 | * 12/1999 |

OTHER PUBLICATIONS

Lee, Sanghyun et al., "Modification of Electrodes in Nanocrystalline Dye-Sensitized $TiO_2$ Solar Cells", *Solar Energy Materials & Solar Cells, Elsevier*, Netherlands, Jan. 2001, vol. 65, No. 1-4, pp. 193-200, Netherlands.

Krüger, Jessica et al., "High Efficiency Solid-State Photovoltaic Device Due to Inhibition of Interface Charge Recombination", *Applied Physics Letters*, Sep. 24, 2001, vol. 79, No. 13, pp. 2085-2087, American Institute of Physics, Melville, NY, USA.

* cited by examiner

PHOTOVOLTAIC CELL

FIELD OF THE INVENTION

The present invention relates to a photovoltaic cell rarely suffering recombination of electrons and/or reverse current (referred to as "back current" hereinafter) of electrons generated by excitation of a photosensitizer and having high photoelectric conversion efficiency.

BACKGROUND OF THE INVENTION

Metal oxide semiconductor materials having high band gap are used as, for example, photoelectric conversion materials, photocatalytic materials, optical sensors and storage battery materials (batteries).

Of these, the photoelectric conversion materials are those from which optical energy can be continuously taken out as electrical energy and are those to convert optical energy into electrical energy using electrochemical reaction between electrodes. When such photoelectric conversion materials are irradiated with light, electrons are generated on one electrode side and move to the other electrode, and then the electrons migrate in the electrolyte as ions and return to the first electrode. Since this energy conversion is continuously made, it can be utilized for, for example, solar cells.

A common solar cell comprises a substrate such as a glass plate having a transparent conductive film as an electrode and a semiconductor film for a photoelectric conversion material thereon, and includes another substrate (e.g., glass plate) having a transparent conductive film as the other electrode, and an electrolyte enclosed between the electrodes.

When a photosensitizer adsorbed on the semiconductor is irradiated with, for example, sunlight, the photosensitizer absorbs light of visible region and is excited. The electrons generated by the excitation move to the semiconductor and to the transparent conductive glass electrode. Then, the electrons move to the other electrode through a conductor connecting the two electrodes. The electrons having moved to the other electrode reduce the oxidation-reduction system in the electrolyte. On the other hand, the photosensitizer having caused the electrons to move to the semiconductor is in a state of an oxidant, and this oxidant is reduced by the oxidation-reduction system in the electrolyte to return to its original state. Thus, the electrons continuously flow, and the photoelectric conversion material functions as a solar cell.

As the photoelectric conversion materials, those wherein a spectrosensitizing dye having absorption in the visible region is adsorbed on the semiconductor surface have been employed. For example, Japanese Patent Laid-Open Publication No. 220380/1989 describes a solar cell having a spectrosensitizing dye layer made of a transition metal complex such as a ruthenium complex on a surface of a metal oxide semiconductor. In National Publication of International Patent No. 504023/1993 (corresponding to WO91/16719), a solar cell having a spectrosensitizing dye layer made of a transition metal complex such as a ruthenium complex on a surface of a titanium oxide semiconductor layer doped with metal ion is described.

For such solar cells, it is important, from the viewpoint of improvement in the photoelectric conversion efficiency, that the electrons rapidly move to the titanium oxide semiconductor layer from the layer of the spectrosensitizing dye such as a ruthenium complex, which has been excited by the light absorption. If the electrons do not move rapidly, recombination of the electrons with the ruthenium complex or reverse current (also referred to as "reverse current" or "back current") of the electrons takes place, resulting in a problem of lowering of the photoelectric conversion efficiency.

On this account, increase of the amount of the spectrosensitizing dye adsorbed on the surface of the titanium oxide semiconductor film or improvement of mobility of the electrons in the titanium oxide semiconductor film has been studied.

For example, it has been proposed that in the formation of the titanium oxide semiconductor film, steps of applying a titania sol onto an electrode substrate, drying the sol and calcining the dried film are repeated to form a porous thick film, that is, a porous semiconductor film is formed to increase the amount of the Ru complex supported on the surface of the semiconductor film. It has been also proposed that the titania fine particles are calcined at a temperature of not lower than 400° C. to improve conductivity. Moreover, it has been proposed in National Publication of International Patent No. 511113/1994 (corresponding to WO93/18532) that, in order to increase the effective surface area, immersion of the film in an aqueous solution of titanium chloride or deposition of titanium chloride on the film is carried out to form a porous titanium oxide layer.

In the above processes, however, calcining of the titanium oxide semiconductor film is carried out to improve the electron mobility. Therefore, the particles are sintered to cause a lowering of porosity, so that there resides a problem that the adsorbed amount of the spectrosensitizing dye is decreased. Thus, the photoelectric conversion efficiency is not always satisfactory, and further improvement has been desired.

The present inventors have disclosed a process for producing titanium oxide semiconductor films for photovoltaic cells and a photovoltaic cell, which have been improved in the above points (Japanese Patent laid-Open Publication No. 339867/1999).

Further, the present inventors have disclosed a photovoltaic cell which uses, in order to inhibit the back current, a metal oxide semiconductor film composed of metal oxide particles having core-shell structure wherein the volume resistance value of the core is lower than that of the shell (Japanese Patent laid-Open Publication No. 155791/2001).

The photoelectric conversion efficiency of the above photovoltaic cells has been improved to a certain extent, but there is a problem that the electromotive force is insufficient or the electromotive force and the photoelectric conversion efficiency are lowered after the cells are used for a long period of time.

In the conventional photovoltaic cells, the adsorbed amount of the spectrosensitizing dye (photosensitizer) is not always large, so that back current is liable to take place, and the photoelectric conversion efficiency is not high. Moreover, the photovoltaic cells tend to absorb ultraviolet rays, and therefore, if they are used for a long period of time, the photosensitizer is gradually decomposed. As a result, the electromotive force and the photoelectric conversion efficiency of the photovoltaic cells are gradually decreased, and the durability of the photovoltaic cells becomes insufficient.

The present invention is intended to solve such problems as described above by providing a photovoltaic cell capable of inhibiting back current and decomposition of a spectrosensitizing dye caused by the ultraviolet rays, possessing high photoelectric conversion efficiency and which is capable of generating high electromotive force.

SUMMARY OF THE INVENTION

Briefly stated, the photovoltaic cell according to the present invention includes:

a substrate having an electrode layer (1) on the surface and having a porous metal oxide semiconductor film (2) (referred to as "semiconductor film" simply hereinafter) which is formed on the electrode layer (1) and on which a photosensitizer is adsorbed, a substrate having an electrode layer (3) on the surface, both of said substrates being arranged in such a manner that the electrode layer (1) and the electrode layer (3) face each other, and an electrolyte layer provided between the semiconductor film (2) and the electrode layer (3), wherein the semiconductor film (2) contains inhibitor of back current, and at least one pair of substrate and electrode layer thereon have transparency.

The inhibitor of back current is preferably an oxide composed of one or more elements selected from Group IIIa and Group IIIb, and the content of the inhibitor of back current in the semiconductor film is preferably in the range of 0.05 to 20% by weight in terms of an oxide.

The inhibitor of back current is preferably present on the surfaces of pores of the semiconductor film and/or the surfaces of metal oxide particles for constituting the semiconductor film.

The component other than the inhibitor of back current in the semiconductor film is preferably composed of one or more metal oxides selected from titanium oxide, lanthanum oxide, zirconium oxide, niobium oxide, tungsten oxide, strontium oxide, zinc oxide, tin oxide and indium oxide.

The photovoltaic cell preferably contains spherical particles having an average particle diameter of 5 to 3000 nm as the metal oxide.

The pore volume of the semiconductor film is preferably in the range of 0.05 to 0.8 ml/g, and the average pore diameter is preferably in the range of 2 to 250 nm.

DETAILED DESCRIPTION OF THE INVENTION

Photovoltaic Cell

Figure 1:
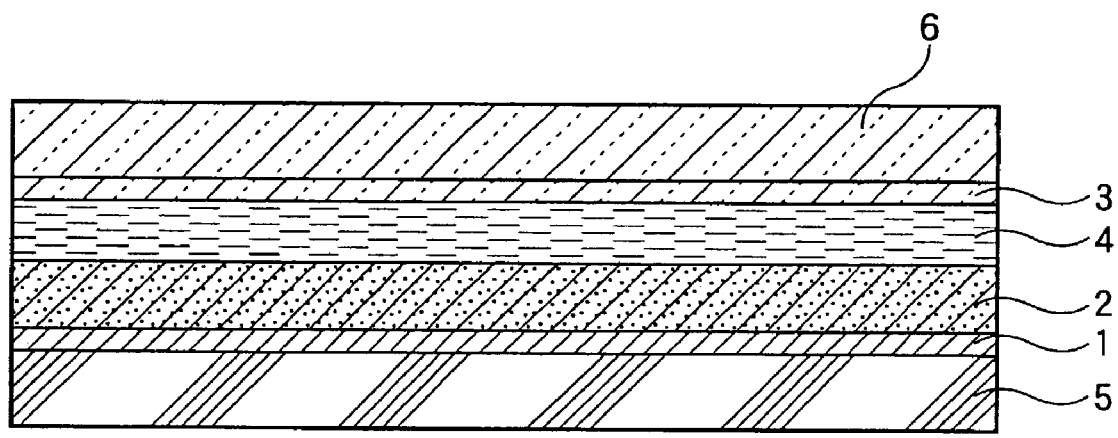
FIG. 1 is a schematic cross-sectional view of one presently preferred embodiment of the photovoltaic cell according to the present invention.

The photovoltaic cell according to the invention is a photovoltaic cell comprising:

a substrate having an electrode layer (1) on the surface and having a porous metal oxide semiconductor film (2) which is formed on the electrode layer (1) and on which a photosensitizer is adsorbed, a substrate having an electrode layer (3) on the surface, both of said substrates being arranged in such a manner that the electrode layer (1) and the electrode layer (3) face each other, and an electrolyte layer provided between the semiconductor film (2) and the electrode layer (3), wherein the semiconductor film (2) contains an inhibitor of back current, and at least one pair of substrate and one electrode layer thereon have transparency.

In the present invention, the inhibitor of back current is contained in the semiconductor film as described above, so that back current can be inhibited, and decomposition of the spectrosensitizing dye caused by the ultraviolet rays can also be inhibited. Hence, the photovoltaic cell exhibits excellent photoelectric conversion efficiency. Moreover, since the inhibitor of back current has ultraviolet screening effect, the photosensitizer is not decomposed, and hence high electromotive force and high photoelectric conversion efficiency can be maintained even when the photovoltaic cell is used for a long period of time.

Such a photovoltaic cell as described above is, for example, a photovoltaic cell shown in FIG. 1.

FIG. 1 is a schematic cross-sectional view of one embodiment of the photovoltaic cell of the present invention.

In the photovoltaic cell shown in FIG. 1, a substrate 5 having a transparent electrode layer 1 on the surface and having a porous semiconductor film 2 which is formed on the surface of the transparent electrode layer 1 and on which a photosensitizer is adsorbed and a substrate 6 having an electrode layer 3 on the surface are arranged in such a manner that the electrode layer 1 and the electrode layer 3 face each other, and between the semiconductor film 2 and the electrode layer 3, an electrolyte 4 is held.

As the transparent substrate 5, a substrate that is transparent and has insulating properties, for example, a glass substrate and a substrate of an organic polymer such as PET are employable.

The substrate 6 is not particularly restricted so long as it has a strength enough to withstand the use, and for example, insulating substrates such as a glass substrate and a substrate of an organic polymer (e.g., PET) and conductive substrates such as those of metallic titanium, metallic aluminum, metallic copper and metallic nickel are employable.

As the transparent electrode layer 1 formed on the surface of the transparent substrate 5, any of electrodes conventionally known, such as those of tin oxide, Sb-, F- or P-doped tin oxide, and Sn- and/or F-doped indium oxide, antimony oxide, zinc oxide and noble metal, is employable.

The transparent electrode layer 1 can be formed by a conventional method such as thermal decomposition method or CVD method.

The electrode layer 3 formed on the surface of the substrate 6 is not particularly restricted so long as it has catalytic reduction ability, and any of conventionally known electrodes is employable. Examples of such electrodes include electrodes of platinum, rhodium, metallic ruthenium and ruthenium oxide, electrodes obtained by plating or depositing these electrode materials on conductive materials such as tin oxide, Sb-, F- or P-doped tin oxide or Sn- and/or F-doped indium oxide or antimony oxide, and a carbon electrode.

The electrode layer 3 can be directly formed on the substrate 6 by coating, plating or deposition, or can be formed by forming a conductive layer of a conductive material through a conventional method such as thermal decomposition or CVD method and then if necessary forming a layer of the above electrode material on the conductive layer through a conventional method such as plating or deposition.

The substrate 6 may be transparent, similar to the transparent substrate 5, and the electrode layer 3 may be transparent, similar to the transparent electrode layer 1.

The visible light transmittances of the transparent substrate 5 and the transparent electrode layer 1 are desirably high and are each preferably not less than 50%, particularly preferably not less than 90%. If the visible light transmittance is less than 50%, the photoelectric conversion efficiency is sometimes lowered.

The resistance values of the transparent electrode layer 1 and the electrode layer 3 are each preferably not more than 100 $\Omega/cm^2$. If the resistance value of each electrode layer exceeds 100 $\Omega/cm^2$, the photoelectric conversion efficiency is sometimes lowered.

Porous Metal Oxide Semiconductor Film

The semiconductor film 2 may be formed on the transparent electrode layer 1 that is provided on the substrate 5, or may be formed on the electrode layer 3 that is provided on the substrate 6. The thickness of the semiconductor film 2 is preferably in the range of 0.1 to 50 µm.

The semiconductor film 2 contains an inhibitor of back current. The inhibitor of back current used herein is an oxide composed of one or more elements selected from Group IIIa and Group IIIb.

Examples of such oxides include oxides of B, Al, Ga, In, Sc, Y, lanthanide elements and actinoid elements, compound oxides thereof, and mixtures of two or more oxides thereof. Of these, oxides of B, Al and Y, compound oxides thereof and mixtures of oxides thereof are excellent in the back current inhibiting effect and ultraviolet screening effect.

Although the reason why the back current is inhibited and the ultraviolet screening effect is exerted by the incorporation of the inhibitor of back current is not clear, it is presumed that the inhibitor of back current and the semiconductor film component together form a compound oxide to change edge properties of the band gap, and thereby the ultraviolet absorption band shifts to the shorter wavelength side (sometimes referred to as "blue shift")

The content of the inhibitor of back current in the semiconductor film is in the range of preferably 0.05 to 20% by weight, more preferably 0.1 to 10% by weight, in terms of an oxide.

If the content (in terms of an oxide) of the inhibitor of back current in the semiconductor film is lower than the lower limit of the above range, sufficient back current inhibiting effect is not obtained, and hence the photoelectric conversion efficiency is not improved satisfactorily. Further, since the ultraviolet screening effect is not obtained, the electromotive force and the photoelectric conversion efficiency are gradually decreased, and thereby the durability sometimes becomes insufficient.

If the content (in terms of an oxide) of the inhibitor of back current in the semiconductor film exceeds the upper limit of the above range, the amount of the inhibitor of back current is so large that the layer of the inhibitor of back current becomes too thick. In some cases, moreover, pores are decreased to make diffusion of the electrolyte impossible, or the adsorbed amount of the photosensitizer becomes insufficient and thereby the photoelectric conversion efficiency becomes insufficient.

The inhibitor of back current is preferably present on the surfaces of pores of the semiconductor film and!or the surfaces of the metal oxide particles for constituting the semiconductor film. Especially when the inhibitor of back current is so present as to cover the metal oxide particles, trapping of electrons hardly takes place on the surfaces of the pores of the semiconductor film and the surfaces of the metal oxide particles, so that the electrons move rapidly without staying on the surface area. Therefore, recombination of electrons or reverse current (back current) does not occur, and the photoelectric conversion efficiency and the electromotive force can be enhanced. The inhibitor of back current may be present in the form of oxide fine particles in the semiconductor film or may form a compound oxide together with the metal oxide particles for constituting the semiconductor film.

The component other than the inhibitor of back current in the semiconductor film, i.e., semiconductor component, is preferably composed of one or more metal oxides selected from titanium oxide, lanthanum oxide, zirconium oxide, niobium oxide, tungsten oxide, strontium oxide, zinc oxide, tin oxide and indium oxide. Of these, crystalline titanium oxide, such as anatase type titanium oxide, brookite type titanium oxide or rutile type titanium oxide, can be preferably employed.

Such a metal oxide has high band gap (approx. 1.7 to 3.8 eV), so that it becomes possible that the photosensitizer absorbs visible light and is excited to generate electrons.

Said metal oxide as the inhibitor of back current may be used as the semiconductor component. However, the oxide used as the inhibitor of back current has preferably higher band gap than the oxide used as the semiconductor.

The semiconductor film is desirably constituted of metal oxide spherical particles. The spherical particles have an average particle diameter of preferably 5 to 3000 nm, more preferably 10 to 600 nm. Also in case of the metal oxide particles coated with the inhibitor of back current, the average particle diameter is preferably in the above range.

If the average particle diameter of the metal oxide particles is less than the lower limit of the above range, cracks are liable to occur in the resulting semiconductor film, and it sometimes becomes difficult to form, by few operations, a thick film which has no cracks and has the later-described thickness. Further, the pore diameter and the pore volume of the semiconductor film are decreased, and hence the adsorbed amount of the photosensitizer is sometimes decreased. If the average particle diameter of the metal oxide particles exceeds the upper limit of the above range, large voids are produced between the particles, and hence the amount of transmitted light is increased to sometimes lower utilization of light, or the semiconductor film occasionally has insufficient strength.

The specific surface area of the metal oxide particles is in the range of preferably 10 to 400 $m^2/g$, more preferably 20 to 300 $m^2/g$. If the specific surface area is less than the lower limit of the above range, the photoelectric conversion efficiency is not increased because the adsorbed amount of the photosensitizer is small. Even if the specific surface area exceeds the upper limit, there is no further increase in the photoelectric conversion efficiency.

The pore volume of the semiconductor film is in the range of preferably 0.05 to 0.8 ml/g, more preferably 0.1 to 0.6 ml/g.

If the pore volume of the semiconductor film is less than the lower limit of the above range, the adsorbed amount of the photosensitizer is decreased. If the pore volume exceeds the upper limit, the electron mobility in the semiconductor film is lowered to sometimes decrease the photoelectric conversion efficiency.

The semiconductor film desirably contains a binder. Although the binder is not particularly restricted, preferable is a titanium oxide binder, a zirconium oxide binder, a tungsten oxide binder or a silica binder, and particularly preferable is a titanium oxide binder.

The titanium oxide binder is preferably one derived from peroxotitanic acid, as described later.

The average pore diameter of the semiconductor film is in the range of preferably 2 to 250 nm, more preferably 5 to 200 nm. If the average pore diameter is less than the lower limit of the above range, the adsorbed amount of the photosensitizers is decreased. If the average pore diameter exceeds the upper limit, the electron mobility in the semiconductor film is lowered to sometimes decrease the photoelectric conversion efficiency.

The process for producing the semiconductor film is not particularly restricted so long as the aforesaid semiconductor film can be obtained, and any of conventionally known processes is adoptable. In particular, the process for producing a metal oxide semiconductor film disclosed in Japanese Patent Laid-Open Publication No. 339867/1999 applied by the present applicant can be preferably employed.

For example, a coating solution consisting of peroxotitanic acid, metal oxide particles and a dispersion medium is applied onto an electrode formed on an insulating substrate, dried and then cured by irradiation with ultraviolet rays or by heating, to form the semiconductor film.

In another process, peroxotitanic acid is prepared by adding hydrogen peroxide to an aqueous solution of a titanium compound or a sol or gel of hydrous titanium oxide. The peroxotitanic acid means hydrous titanium peroxide and has absorption in the visible region.

The sol or gel of hydrous titanium oxide is obtained by adding an acid or an alkali to an aqueous solution of a titanium compound to hydrolyze the compound and then optionally conducting washing or washing and heat maturing.

The titanium compound is not particularly restricted, and examples of the titanium compounds used herein include titanium salts, such as titanium halides and titanium sulfate, titanium alkoxides, such as tetraalkoxytitanium, and titanium hydride.

Then, an alkali, preferably ammonia and/or amine, is added to the peroxotitanic acid to make it alkaline, followed by heat maturing at a temperature of 80 to 350° C., to obtain titania colloidal particles. If necessary, the titania colloidal particles may be added as seed particles to the peroxotitanic acid and then the above steps may be repeated. Through X-ray diffractometry, the titania colloidal particles thus obtained are found to be those of anatase type titanium oxide, brookite type titanium oxide or rutile type titanium oxide having high crystallinity, though they vary depending upon the type and the quantity of the base used.

The particle diameter of the anatase type titanium oxide particles is preferably in the range of 5 to 600 nm. If the particle diameter is less than 5 nm, cracks are liable to occur in the resulting semiconductor film, and it becomes difficult to form; by few operations, a thick film which has no cracks and has the later-described thickness. Further, the pore diameter and the pore volume of the semiconductor film are decreased, and thereby the adsorbed amount of the photosensitizer is decreased, so that such a particle diameter is undesirable.

If the particle diameter thereof exceeds 600 nm, stability of the coating solution tends to be lowered.

The weight ratio between the binder and the metal oxide particles (titania colloidal particles) is in the range of preferably 0.05 to 0.50, particularly preferably 0.1 to 0.3, in terms of $TiO_2$. If the ratio is less than 0.05, absorption of light in the visible region is insufficient, and besides the effect in increase of the adsorbed amount of the photosensitizer is not obtained in some cases. If the ratio exceeds 0.50, a dense semiconductor film is not obtained and the electron mobility is not enhanced in some cases.

The dispersion medium is not particularly restricted so long as it can disperse the binder component and the metal oxide particles and it can be removed when dried, but preferable are alcohols. In the coating solution, a film-forming assistant may be contained when needed. By the addition of the film-forming assistant, viscosity of the coating solution is increased, and hence a uniformly dried film can be obtained. Further, the titania colloidal particles are densely filled, and a semiconductor film composed of titanium oxide having high adhesion to the electrode can be obtained, so that addition of the film-forming assistant is preferable. Examples of the film-forming assistants include polyethylene glycol, polyvinyl pyrrolidone, hydroxypropyl cellulose, polyacrylic acid and polyvinyl alcohol.

The coating solution can be applied by a conventional method, such as dipping, spinning, spraying, roll coating, ink jet printing or flexographic printing.

The coating solution is applied in an amount such that the semiconductor film finally obtained should have a thickness of 0.1 to 50 μm.

Subsequently, the coating solution thus applied is dried, then irradiated with ultraviolet rays to be cured, and heat treated to perform decomposition of the film-forming assistant and annealing, whereby a titanium oxide semiconductor film is formed. The drying temperature has only to be a temperature at which the dispersion medium can be removed. The irradiation dose of the ultraviolet rays, though varies depending upon the content of the peroxotitanic acid, etc., has only to be that necessary for decomposing the peroxotitanic acid and curing the film.

The thickness of the semiconductor film obtained by the above process is preferably in the range of 0.1 to 50 μm.

In the present invention, the semiconductor film obtained by the conventional process as described above contains the inhibitor of back current.

The method to introduce the inhibitor of back current into the semiconductor film is not particularly restricted. For example, the semiconductor film is immersed in a solution of the inhibitor of back current (or precursor) to allow the semiconductor film to absorb the compound, optionally followed by hydrolysis to precipitate the inhibitor of back current on the semiconductor film surface. Then, the film is dried and calcined. A thin film layer of the inhibitor of back current may be formed by the CVD method, using a chloride, a carbonate or an alkoxide.

The inhibitor of back current may be added after the coating solution applied onto the electrode is dried or after it is cured.

Further, it is also possible that the metal oxide particles for constituting the semiconductor film are previously coated with a layer of the inhibitor of back current and using the thus treated particles the semiconductor film is formed in the same manner as described above. More specifically, a coating solution consisting of metal oxide particles having been coated with a layer of the inhibitor of back current, peroxotitanic acid and a dispersion medium is applied onto an electrode formed on an insulating substrate, then dried and cured to form a semiconductor film.

The metal oxide particles can be coated with a layer of the inhibitor of back current by, for example, the following method. The metal oxide particles (titanium oxide particles) are dispersed in a solution of the inhibitor of back current(or precursor) to allow the metal oxide particles to absorb the inhibitor of back current compound, optionally followed by hydrolysis to precipitate the compound on the surfaces of the titanium oxide particles and hydrothermal treatment in an autoclave. Then, the film is dried and calcined.

In the present invention, after the semiconductor film is formed by the use of the metal oxide particles having been coated with a layer of the inhibitor of back current, the inhibitor of back current may be further introduced onto the surface of the semiconductor film. Also in this case, the content of the inhibitor of back current in the semiconductor film is preferably in the range of 0.05 to 20% by weight in terms of an oxide.

Since the coating layer of the inhibitor of back current exerts ultraviolet screening effect, deterioration of a photosensitizer does not occur, and hence a photovoltaic cell having excellent durability can be obtained.

In the photovoltaic cell of the invention, a photosensitizer is adsorbed on the semiconductor film.

The photosensitizer is not particularly restricted so long as it absorbs light of visible region and/or infrared region and is excited. For example, an organic dye, a metal complex or the like is employable.

As the organic dye, a conventionally known organic dye having a functional group, such as carboxyl group, hydroxyalkyl group, hydroxyl group, sulfone group or carboxyalkyl group, in its molecule is employable. Examples of such organic dyes include metal-free phthalocyanine, cyanine dyes, metallocyanine dyes, triphenylmethane dyes, and xanthene dyes, such as Uranin, eosin, rose bengal, Rhodamine B and dibromofluorescein. These organic dyes have characteristics of a high rate of adsorption on the semiconductor film.

Examples of the metal complexes include metal phthalocyanines, such as copper phthalocyanine and titanyl phthalocyanine; chlorophyll; hemin; ruthenium-cis-diaquobipyridyl complexes, such as ruthenium-tris(2,2'-bispyridyl-4,4'-dicarboxylate), cis-(SCN$^-$)-bis(2,2'-bipyridyl-4,4'-dicarboxylate) ruthenium and ruthenium-cis-diaquobis(2,2'-bipyridyl-4,4'-dicarboxylate); porphyrin complexes, such as zinc-tetra(4-carboxyphenyl)porphyrin; and complexes of ruthenium, osmium, iron and zinc, such as iron-hexacyanide complex as disclosed in Japanese Patent laid-open Publication No. 220380/1989 and National Publication of International Patent No. 504023/1993. These metal complexes have excellent spectrosensitizing effect and durability.

These organic dyes and metal complexes as the photosensitizers may be used singly, or may be used as a mixture of two or more organic dyes or metal complexes, or may be used in combination of the organic dye with the metal complex.

There is no specific limitation on the adsorption method of the photosensitizer, and methods generally used are adoptable. For example, the semiconductor film is allowed to absorb a solvent solution of the photosensitizer by dipping, spinner method or spraying and then dried. The absorption step may be repeated, when needed. The photosensitizer may be adsorbed on the semiconductor film by contacting it with the substrate (and the semiconductor film thereon) while the photosensitizer solution is refluxed under heating.

The solvent for dissolving the photosensitizer has only to be one capable of dissolving the photosensitizer, and examples of such solvents include water, alcohols, toluene, dimethylformamide, chloroform, ethyl cellosolve, N-methylpyrrolidone and tetrahydrofuran.

The amount of the photosensitizer adsorbed on the semiconductor film is preferably not less than 50 µg based on 1 cm$^2$ of the specific surface area of the semiconductor film. If the amount of the photosensitizer is less than 50 µg, the photoelectric conversion efficiency sometimes becomes insufficient.

In the photovoltaic cell of the invention, the semiconductor film 2 and the electrode layer 3 are arranged so as to face each other, the sides are sealed with a resin or the like, and an electrolyte is enclosed between the electrodes to form an electrolyte layer 4.

In the photovoltaic cell of the invention, spacer particles may be interposed between the semiconductor film and the electrode layer. The spacer particles may be embedded in the semiconductor film in such a manner that at least a part of the spacer particles protrude from the semiconductor film and are brought into contact with the electrode layer 3.

The spacer particles are not particularly restricted so long as they do not injure the semiconductor film and the electrode layer and they make it possible that the semiconductor film and the electrode layer are not contacted with each other. For example, spherical spacer particles, rod-like spacer particles, etc. are employable. Further, insulating particles conventionally known, such as particles of resins (plastics), organic-inorganic composites, metal oxides and ceramics, are employable. By the interposition of the spacer particles, a photovoltaic cell having a small distance between the semiconductor film 2 and the electrode layer 3, e.g., about 1 to 50 µm, can be obtained.

The spacer particles made of resins are, for example, resin particles disclosed in Japanese Patent Publication No. 95165/1995. The spacer particles made of organic-inorganic composites preferably used are, for example, particles obtained by hydrolysis of metal alkoxide, which are disclosed in Japanese Patent Laid-Open Publication No. 140472/1995 and Japanese Patent Publication No. 257392/1996. The spacer particles made of metal oxides or ceramics preferably used are, for example, completely spherical particles disclosed in Japanese Patent Laid-Open Publication No. 218915/1999 and Japanese Patent Publication No. 64548/1995. Particles wherein synthetic resins are fused to the above-exemplified particles can also be preferably employed. As such particles, resin-coated particles disclosed in Japanese Patent Laid-Open Publication No. 94224/1988 are preferable. In particular, particles coated with an adhesive resin can be bonded to the semiconductor film and/or the electrode layer and fixed without migration, so that they can effectively contribute to uniform gap adjustment and stress absorption.

Electrolyte Layer

As the electrolyte, a mixture of an electrochemically active salt and at least one compound to form an oxidation-reduction system is employed.

Examples of the electrochemically active salts include quaternary ammonium salts, such as tetrapropylammonium iodide and tetrabutylammonium iodide, imidazolium iodide, lithium iodide, 1-ethyl-3-methylimidazolium, 1-butyl-3-methylimidazolium, 1,2-dimethyl-3-propylimidazolium, 1,2-dimethylimidazolium, tetrafluoroboric acid, hexafluorophosphoric acid, trifluoromethanesulfohic acid and bistrifluoromethanesulfonic acid imide. Examples of the compounds to form an oxidation-reduction system include quinone, hydroquinone, iodine, potassium iodide, bromine and potassium bromide. Admixture of these compounds is also employable.

For the electrolyte layer 4, the electrolyte may be used as it is when it is liquid, but the electrolyte is usually used as its solvent solution, namely, an electrolytic solution. The electrolyte concentration in the solution is preferably in the range of 0.1 to 5 mol/liter, though it varies depending upon the type of the electrolyte and the type of the solvent used.

Other than the electrolytic solution, a solid electrolyte may be used as the electrolyte, and examples of the solid electrolytes include CuI and CuSCN.

As the solvent, a conventionally known solvent is employable. Examples of such solvents include water, alcohols, oligo ethers, carbonates such as propione carbonate, phosphoric acid esters, dimethylformamide, dimethyl sulfoxide, N-methylpyrrolidone, N-vinylpyrrolidone, sulfur compounds such as sulfolane 66, ethylene carbonate, acetonitrile and γ-butyrolactone.

In the present invention, liquid crystals conventionally known, such as smectic liquid crystal, nematic liquid crystal and cholesteric liquid crystal, can be used together with the electrolyte by adding them to the solvent, as proposed by the present applicant in Japanese Patent Laid-Open Publication No. 015182/2001.

In the photovoltaic cell of the invention, further, a nonporous metal oxide film may be interposed between the electrode layer and the photosensitizer-adsorbed semiconductor film. By the interposition of such a film, the electrolyte (electrolyte anion) having passed through the pores of the semiconductor film is prevented from contact with the electrode layer of one substrate, and hence the photoelectric conversion efficiency is enhanced. Moreover, corrosion of the electrode is inhibited, and stable photoelectric conversion efficiency can be maintained for a long period of time.

According to the present invention, the semiconductor film contains an inhibitor of back current, so that trapping of electrons hardly takes place on the surface area of pores of the semiconductor film and on the surface area of the metal oxide particles, and therefore the electrons do not reside on the surface area and smoothly move to the electrode. Accordingly, a photovoltaic cell free from occurrence of recombination of electrons or reverse current (back current) and having high photoelectric conversion efficiency and high electromotive force can be obtained.

Further, the coating layer of the inhibitor of back current formed on the surface area of the pores of the semiconductor film and the surface area of the metal oxide particles exerts ultraviolet screening effect, so that deterioration of the photosensitizer does not occur, and hence a photovoltaic cell having excellent durability can be obtained.

EXAMPLE

The present invention is further described with reference to the following examples, but it should be construed that the invention is in no way limited to those examples.

Example 1

Formation of Metal Oxide Semiconductor Film (A)

In 1 liter of pure water, 5 g of titanium hydride was suspended. To the suspension, 400 g of a hydrogen peroxide solution having a concentration of 5% was added over a period of 30 minutes, and they were heated to 80° C. to prepare a solution of peroxotitanic acid. Then, 90% of the solution was dispensed, and thereto was added concentrated aqueous ammonia to adjust the solution to pH 9. The solution was placed in an autoclave and subjected to hydrothermal treatment at 250° C. for 5 hours under saturated vapor pressure to prepare a dispersion of titania colloidal particles (A). As a result of X-ray diffractometry, the particles proved to be those of anatase type titanium oxide having high crystallinity. The average particle diameter is set forth in Table 1. Subsequently, the dispersion of titania colloidal particles (A) obtained above was concentrated to at concentration of 10%, and the resulting dispersion was mixed with the peroxotitanic acid solution prepared above. To the mixture, hydroxypropyl cellulose was added as a film-forming assistant in such an amount that titanium in the resulting mixture became 30% by weight in terms of $TiO_2$, to prepare a coating solution for forming a semiconductor film. The coating solution was applied onto a transparent glass substrate having thereon an electrode of fluorine-doped tin oxide, subjected to air drying, then irradiated with ultraviolet rays of 6000 mJ/$cm^2$ by the use of a low-pressure mercury lamp to decompose the peroxo acid and to cure the film. The film was further heated at 300° C. for 30 minutes to perform decomposition of hydroxypropyl cellulose and annealing, whereby a titanium oxide semiconductor film (A') was formed.

Separately, 5 g of t-butoxyaluminum was dissolved in 50 cc of t-butyl alcohol to prepare a solution of an inhibitor of back current.

In this solution, the transparent glass substrate with the titanium oxide semiconductor film (A') was immersed for 1 hour, taken out of the solution, then dried and calcined at 450° C. for 20 minutes to form a titanium oxide semiconductor film containing, the inhibitor of back current.

The thickness of the titanium oxide semiconductor film containing the inhibitor of back current and the pore volume and average pore diameter determined by the nitrogen adsorption method are set forth in Table 1.

Adsorption of Photosensitizer

Subsequently, a ruthenium complex represented by cis-($SCN^-$)-bis(2,2'-bipyridyl-4,4'-dicarboxylate)ruthenium(II) was dissolved as a photosensitizer in ethanol to prepare a solution having a concentration of $3 \times 10^{-4}$ mol/l. The resulting photosensitizer solution was applied onto the titanium oxide semiconductor film by means of a 100-rpm spinner and dried. The application and drying process was repeated 5 times. As the amount of the photosensitizer adsorbed on the titanium oxide semiconductor film, an amount based on 1 $cm^2$ of the specific surface area of the titanium oxide semiconductor film is set forth in Table 1.

Preparation of Photovoltaic Cell

In a mixed solvent of acetonitrile and ethylene carbonate in a volume ratio of 1:4 (acetonitrile:ethylene carbonate), tetrapropylammonium iodide and iodine were dissolved in such amounts that their concentrations became 0.46 mol/l and 0.06 mol/l; respectively, to prepare an electrolytic solution.

The electrode prepared above was used as one electrode, and a transparent glass substrate having, as the other electrode, an electrode of fluorine-doped tin oxide and having platinum supported on the electrode was placed in such a manner that those electrodes faced each other. Then, the sides were sealed with a resin, and between the electrodes, the electrolytic solution prepared above was held. Then, the electrodes were connected by a lead wire to prepare a photovoltaic cell (A).

The photovoltaic cell was irradiated with light having an intensity of 100 W/$m^2$ by means of a solar simulator at an incidence angle of 90° (90° against the cell surface) to measure Voc (voltage in a state of open circuit), Joc (density of current in case of short circuit), FF (curve factor) and η (conversion efficiency) The results are set forth in Table 1.

Evaluation of Durability

The photovoltaic cell (A) was directly irradiated with sunlight for a total period of 500 hours and then irradiated with light having an intensity of 100 W/$m^2$ by means of a solar simulator at an incidence angle of 90° (90° against the cell surface) to measure Voc, Joc, FF and η.

The results are set forth in Table 1.

Example 2

Formation of Metal Oxide Semiconductor Film (B)

To 1000 g of a dispersion of titania colloidal particles (A) having a concentration of 10% by weight obtained in the same manner as in Example 1, 110 g of an aluminum nitrate aqueous solution having a concentration of 1% by weight in terms of $Al_2O_3$ was added, and then aqueous ammonia having a concentration of 15% by weight was added to adjust the dispersion to pH 8.5 and to hydrolyze aluminum nitrate. Subsequently, the dispersion was subjected to heat maturing at 80° C. for 20 minutes, and then ammonium ion, nitric acid ion, etc. were removed by an amphoteric ion exchange resin to obtain a dispersion of titania colloidal particles (B) coated with $Al_2O_3$ (hydrate) as an inhibitor of back current. The dispersion was concentrated to a concentration of 10% by weight. Then, a titanium oxide semiconductor film (B) containing Al$_2$O$_3$ as an inhibitor of back current was formed in the same manner as in Example 1, except that the dispersion (B) of titania colloidal particles (C) having a concentration of 10% by weight was used.

Adsorption of Photosensitizer

Adsorption of a photosensitizer was carried out in the same manner as in Example 1. The amount of the photosensitizer adsorbed on the titanium oxide semiconductor film (B) is set forth in Table 1.

Preparation of Photovoltaic Cell

A photovoltaic cell (B) was prepared in the same manner as in Example 1. Then, Voc, Joc, FF, η and durability were measured. The results are set forth in Table 1.

Example 3

Formation of Metal Oxide Semiconductor Film (C)

To 1000 g of a dispersion of titania colloidal particles (A) having a concentration of 10% by weight obtained in the same manner as in Example 1, 200 g of a yttrium nitrate aqueous solution having a concentration of 1% by weight in terms of Y$_2$O$_3$ was added, and then aqueous ammonia having a concentration of 15% by weight was added to adjust the dispersion to pH 7.0 and to hydrolyze yttrium nitrate. Subsequently, the dispersion was subjected to heat maturing at 80° C. for 20 minutes, and then ammonium ion, nitric acid ion, etc. were removed by an amphoteric ion exchange resin to obtain a dispersion of titania colloidal particles (C) coated with Y$_2$O$_3$ (hydrate) as inhibitor of back current. The dispersion was concentrated to a concentration of 10% by weight. Then, a titanium oxide semiconductor film (C) containing Y$_2$O$_3$ as an inhibitor of back current was formed in the same manner as in Example 1, except that the dispersion of titania colloidal particles (C) having a concentration of 10% by weight was used.

Adsorption of Photosensitizer

Adsorption of a photosensitizer was carried out in the same manner as in Example 1. The amount of the photosensitizer adsorbed on the titanium oxide semiconductor film (C) is set forth in Table 1.

Preparation of Photovoltaic Cell

A photovoltaic cell (C) was prepared in the same manner as in Example 1. Then, Voc, Joc, FF, η and durability were measured. The results are set forth in Table 1.

Example 4

Formation of Metal Oxide Semiconductor Film (D)

With pure water, 18.3 g of titanium tetrachloride was diluted to obtain an aqueous solution having a concentration of 1.0% in terms of TiO$_2$. To the aqueous solution, aqueous ammonia having a concentration of 15% by weight was added with stirring, to obtain a white slurry of pH 9.5. The slurry was washed by filtration to obtain a cake of a hydrous titanium oxide gel having a concentration of 10.2% by weight in terms of TiO$_2$. The cake was mixed with 400 g of a hydrogen peroxide solution having a concentration of 5% and heated to 80° C. to prepare a solution of peroxotitanic acid. Then, 90% of the solution was dispensed, and thereto was added concentrated aqueous ammonia to adjust the solution to pH 9. The solution was placed in an autoclave and subjected to hydrothermal treatment at 250° C. for 5 hours under saturated vapor pressure to prepare a dispersion of titania colloidal particles (D). As a result of X-ray diffractometry, the particles proved to be those of anatase type titanium oxide having high crystallinity.

The average particle diameter is set forth in Table 1.

Subsequently, the dispersion of titania colloidal particles (D) obtained above was adjusted to a concentration of 10%. To the dispersion, 550 g of an aluminum nitrate aqueous solution having a concentration of 1% by weight in terms of Al$_2$O$_3$ was added, and then aqueous ammonia having a concentration of 15% by weight was added to adjust the dispersion to pH 8.5 and to hydrolyze aluminum nitrate. Subsequently, the dispersion was subjected to heat maturing at 80° C. for 20 minutes, and then ammonium ion, nitric acid ion, etc. were removed by an amphoteric ion exchange resin to obtain a dispersion of titania colloidal particles (D) coated with Al$_2$O$_3$ (hydrate) as an inhibitor of back current. The dispersion was concentrated to a concentration of 10% by weight. Then, a titanium oxide semiconductor film (D) containing Al$_2$O$_3$ as an inhibitor of back current was formed in the same manner as in Example 1, except that the dispersion of titania colloidal particles (D) having a concentration of 10% by weight was used.

Adsorption of Photosensitizer

Adsorption of a photosensitizer was carried out in the same manner as in Example 1. The amount of the photosensitizer adsorbed on the titanium oxide semiconductor film (D) is set forth in Table 1.

Preparation of Photovoltaic Cell

A photovoltaic cell (D) was prepared in the same manner as in Example 1. Then, Voc, Joc, FF, η and durability were measured. The results are set forth in Table 1.

Example 5

Formation of Metal Oxide Semiconductor Film (E)

To 1000 g of a dispersion of titania colloidal particles (D) having a concentration of 10% by weight obtained in the same manner as in Example 4, 1000 g of a yttrium nitrate aqueous solution having a concentration of 1% by weight in terms of Y$_2$O$_3$ was added, and then aqueous ammonia having a concentration of 15% by weight was added to adjust the dispersion to pH 7.0 and to hydrolyze yttrium nitrate. Subsequently, the dispersion was subjected to heat maturing at 80° C. for 20 minutes, and then ammonium ion, nitric acid ion, etc. were removed by an amphoteric ion exchange resin to obtain a dispersion of titania colloidal particles (E) coated with Y$_2$O$_3$ (hydrate) as an inhibitor of back current. The dispersion was concentrated to a concentration of 10% by weight. Then, a titanium oxide semiconductor film (E) containing Y$_2$O$_3$ as an inhibitor of back current was, formed in the same manner as in Example 1, except that the dispersion of titania colloidal particles (E) having a concentration of 10% by weight was used.

Adsorption of Photosensitizer

Adsorption of a photosensitizer was carried out in the same manner as in Example 1. The amount of the photosensitizer adsorbed on the titanium oxide semiconductor film (E) is set forth in Table 1.

Preparation of Photovoltaic Cell

A photovoltaic cell (E) was prepared in the same manner as in Example 1. Then, Voc, Joc, FF, η and durability were measured. The results are set forth in Table 1.

Comparative Example 1

Adsorption of Photosensitizer

A titanium oxide semiconductor film (F) coated with no inhibitor of back current was formed in the same manner as in Example 1. Then, adsorption of a photosensitizer on the semiconductor film was carried out. The amount of the photosensitizer adsorbed on the titanium oxide semiconductor film (F) is set forth in Table 1. (That is to say, adsorption of an inhibitor of back current was not conducted.)

Preparation of Photovoltaic Cell

A photovoltaic cell (F) was prepared in the same manner as in Example 1. Then, Voc, Joc, FF, η and durability were measured. The results are set forth in Table 1.

Comparative Example 2

Formation of Metal Oxide Semiconductor Film (G)

A titanium oxide semiconductor film (G) was formed in the same manner as in Example 4, except that coating with $Al_2O_3$ as the inhibitor of back current was not conducted.

Adsorption of Photosensitizer

Adsorption of a photosensitizer was carried out in the same manner as in Example 1. The amount of the photosensitizer adsorbed on the titanium oxide semiconductor film (G) is set forth in Table 1.

Preparation of Photovoltaic Cell

A photovoltaic cell (G) was prepared in the same manner as in Example 1. Then, Voc, Joc, FF, η and durability were measured. The results are set forth in Table 1.

What is claimed is:

1. A photovoltaic cell comprising:
   a first substrate having a first electrode layer (1) on the surface and having a porous metal oxide semiconductor film (2) which is formed on the first electrode layer (1) and on which a photosensitizer is adsorbed,
   a second substrate having a second electrode layer (3) on the surface,
   both of said substrates being arranged in such a manner that the first electrode layer (1) and the second electrode layer (3) face each other, and
   an electrolyte layer provided between the porous metal oxide semiconductor film (2) and the second electrode layer (3),
   wherein the semiconductor film (2) includes metal oxide particles and contains an inhibitor of back current, each of the metal oxide particles for constituting the semiconductor film being coated with a layer of the inhibitor of back current, and at least one pair of substrate and electrode layer thereon have transparency.

2. The photovoltaic cell as claimed in claim 1, wherein the inhibitor of back current is an oxide composed of one or more elements selected from Group IIIa and Group IIIb, and the content of the inhibitor of back current in the semiconductor film is in the range of 0.05 to 20% by weight in terms of an oxide.

3. The photovoltaic cell as claimed in claim 1, wherein the component other than the inhibitor of back current in the semiconductor film is composed of one or more metal oxides selected from titanium oxide, lanthanum oxide, zirconium oxide, niobium oxide, tungsten oxide, strontium oxide, zinc oxide, tin oxide and indium oxide.

TABLE 1

| | Metal oxide particle | | | | | Semiconductor film | | | | | | | |
|---|---|---|---|---|---|---|---|---|---|---|---|---|---|
| | | | Average particle | Inhibitor of back current | | Metal oxide | Binder | Inhibitor of back current | | Film thick- | Pore | Average pore | Photosensitizer adsorbed |
| | Type | Crystal form | diameter (nm) | Type | Amount (wt %) | particle (wt %) | Oxide (wt %) | Type | Amount (wt %) | ness μm | volume cc/g | diameter nm | amount μg/cm² |
| Ex. 1 | $TiO_2$ | anatase | 40 | — | — | 69.2 | 29.7 | $Al_2O_3$ | 1.1 | 11 | 0.6 | 15 | 220 |
| Ex. 2 | $TiO_2$ | anatase | 40 | $Al_2O_3$ | 1.0 | 70 | 30 | — | — | 10 | 0.6 | 16 | 230 |
| Ex. 3 | $TiO_2$ | anatase | 40 | $Y_2O_3$ | 1.0 | 70 | 30 | — | — | 11 | 0.6 | 18 | 210 |
| Ex. 4 | $TiO_2$ | anatase | 15 | $Al_2O_3$ | 5.0 | 70 | 30 | — | — | 11 | 0.5 | 9 | 180 |
| Ex. 5 | $TiO_2$ | anatase | 15 | $Y_2O_3$ | 5.0 | 70 | 30 | — | — | 12 | 0.5 | 10 | 160 |
| Comp. Ex. 1 | $TiO_2$ | anatase | 40 | — | — | 70 | 30 | — | — | 12 | 0.6 | 18 | 200 |
| Comp. Ex. 2 | $TiO_2$ | anatase | 15 | — | — | 70 | 30 | — | — | 9 | 0.5 | 10 | 150 |

| | Photovoltaic cell | | | | | | | |
|---|---|---|---|---|---|---|---|---|
| | Cell properties | | | | Durability | | | |
| | Voc V | Joc mA/cm² | FF | η % | Voc V | Joc mA/cm² | FF | η % |
| Ex. 1 | 0.75 | 1.50 | 0.70 | 7.8 | 0.75 | 1.35 | 0.70 | 7.8 |
| Ex. 2 | 0.79 | 1.55 | 0.73 | 8.9 | 0.79 | 1.40 | 0.73 | 8.0 |
| Ex. 3 | 0.78 | 1.49 | 0.72 | 8.4 | 0.78 | 1.41 | 0.70 | 7.7 |
| Ex. 4 | 0.8 | 1.50 | 0.70 | 8.4 | 0.8 | 1.43 | 0.70 | 8.0 |
| Ex. 5 | 0.78 | 1.47 | 0.70 | 8.0 | 0.78 | 1.45 | 0.72 | 8.1 |
| Comp. Ex. 1 | 0.71 | 1.47 | 0.72 | 7.5 | 0.70 | 1.23 | 0.60 | 5.2 |
| Comp. Ex. 2 | 0.64 | 1.48 | 0.70 | 6.6 | 0.60 | 1.43 | 0.50 | 4.2 |

4. The photovoltaic cell as claimed in claim 3, which contains spherical particles having an average particle diameter of 5 to 3000 nm as the metal oxide.

5. The photovoltaic cell as claimed in claim 1, wherein the pore volume of the semiconductor film is in the range of 0.05 to 0.8 ml/g and the average pore diameter is in the range of 2 to 250 nm.

6. The photovoltaic cell as claimed in claim 2, wherein the component other than the inhibitor of back current in the semiconductor film is composed of one or more metal oxides selected from titanium oxide, lanthanum oxide, zirconium oxide, niobium oxide, tungsten oxide, strontium oxide, zinc oxide, tin oxide and indium oxide.

7. The photovoltaic cell as claimed in claim 6, which contains spherical particles having an average particle diameter of 5 to 3000 nm as the metal oxide.

8. The photovoltaic cell as claimed in claim 2, wherein the pore volume of the semiconductor film is in the range of 0.05 to 0.8 ml/g and the average pore diameter is in the range of 2 to 250 nm.

9. The photovoltaic cell as claimed in claim 1, wherein the pore volume of the semiconductor film is in the range of 0.05 to 0.8 ml/g and the average pore diameter is in the range of 2 to 250 nm.

10. The photovoltaic cell as claimed in claim 3, wherein the pore volume of the semiconductor film is in the range of 0.05 to 0.8 ml/g and the average pore diameter is in the range of 2 to 250 nm.

11. The photovoltaic cell as claimed in claim 4, wherein the pore volume of the semiconductor film is in the range of 0.05 to 0.8 ml/g and the average pore diameter is in the range of 2 to 250 nm.

12. The photovoltaic cell as claimed in claim 6, wherein the pore volume of the semiconductor film is in the range of 0.05 to 0.8 ml/g and the average pore diameter is in the range of 2 to 250 nm.

* * * * *